United States Patent [19]
Walden et al.

[11] Patent Number: 5,153,593
[45] Date of Patent: Oct. 6, 1992

[54] MULTI-STAGE SIGMA-DELTA ANALOG-TO-DIGITAL CONVERTER

[75] Inventors: Robert H. Walden, Newbury Park; Gabor C. Temes, Los Angeles, both of Calif.; Tanju Cataltepe, Red Bank, N.J.

[73] Assignee: Hughes Aircraft Company, Los Angeles, Calif.

[21] Appl. No.: 514,990

[22] Filed: Apr. 26, 1990

[51] Int. Cl.⁵ .............................................. H03M 1/12
[52] U.S. Cl. .................................. 341/143; 341/155; 375/026
[58] Field of Search ............... 341/156, 155, 120, 121, 341/118, 143, 140; 375/26, 27, 28, 33

[56] References Cited

U.S. PATENT DOCUMENTS

| | | | |
|---|---|---|---|
| 4,862,169 | 8/1989 | Van Bavel et al. | 341/143 |
| 4,999,627 | 3/1991 | Agazzi | 341/131 |

OTHER PUBLICATIONS

"Design and Implementation of an Audio 18-Bit Analog-to-Digital Converter Using Oversampling Techniques*", R. W. Adams, J. Audio Eng. Soc., vol. 34, No. 3, Mar. 1986, pp. 153–166.

"Improved Signal-to-Noise Ratio Using Tri-level Delta-Sigma Modulation", J. J. Paulos et al., 1987 IEEE, pp. 463–466, CH2394-5/87/0000-0463.

"A 16-bit Oversampling A-to-D Conversion Technology Using Triple-Integration Noise Shaping", Y. Matsuya et al., IEEE J. of Solid-State Circuits, vol. SC22, No. 6, Dec. 1987, pp. 921–929.

"VLSI-A to D and D to A Converters with Multi-Stage Noise Shaping Modulators", K. Uchimura et al., 1986 IEEE, ICASSP, 86, pp. 1545–1548, ICASSP 86, Tokyo.

T. Cataltepe, et al., "Digitally Corrected Multi-Bit ΣΔ Data Converters", ISCAS 1989, 1989 IEEE, pp. 647–650.

Primary Examiner—A. D. Pellinen
Assistant Examiner—Brian K. Young
Attorney, Agent, or Firm—V. D. Duraiswamy; P. M. Coble; W. K. Denson-Low

[57] ABSTRACT

A precision sigma-delta A/D converter having a desired number of cascaded stages is disclosed herein. The multi-stage sigma-delta analog-to-digital converter (10) of the present invention is operative to convert an analog input signal X(z) to an output sequence of digital words. The converter (10) of the present invention includes a first sigma-delta converter stage (14) for generating a first sequence of digital words and a quantization error signal in response to the analog input signal X(z). An interstage amplifier (34) then amplifies the quantization error signal by a first gain factor G. The present invention further includes a second sigma-delta converter stage (18) for generating a second sequence of digital words in response to the amplified quantization error signal. The first and second sequences are next filtered by a digital noise cancellation network (31, 32) and the filtered second sequence is divided by the first gain factor G via a divider circuit (38). A summing circuit (40) provides the output sequence of digital words by summing the filtered first sequence and the divided second sequence. The digital noise cancellation network (32) is also used to compensate for errors due to analog component imperfections, e.g., capacitor mismatches and finite operational amplifier gain.

10 Claims, 3 Drawing Sheets

MULTI-STAGE SIGMA-DELTA ANALOG-TO-DIGITAL CONVERTER

The Government has rights in this invention pursuant to Contract N66001-86-C-0193 awarded by the Department of the Navy.

BACKGROUND OF THE INVENTION

1. Field of the Invention

This invention relates to analog-to-digital converters. More specifically, this invention relates to analog-to-digital converters employing sigma-delta modulation.

While the present invention is described herein with reference to a particular embodiment, it is understood that the invention is not limited thereto. Those having ordinary skill in the art and access to the teachings provided herein will recognize additional embodiments within the scope thereof.

2. Description of the Related Art

Recent developments in the field of digital signal processing, particularly within the areas of radar, digital radio, digital television, have accentuated the demand for fast accurate analog-to-digital (A/D) converters. Accuracy may gauged by measuring the signal-to-noise ratio of the output generated by the converter, with the result often being expressed in a particular bit resolution. Conventionally, either the successive approximation or dual-ramp conversion technique is used for high (i.e. 16-bit or greater) resolution A/D converters. One difficulty with the successive approximation approach is that trimming a weighting network associated therewith is necessary to achieve a conversion accuracy in excess of 15 bits. The requirement of trimming inhibits production efficiency and increases unit costs. High resolution is effected through the dual-ramp technique by utilizing, for example, precision high-speed integrator and sample-and-hold circuits. These circuits are generally realized only in certain specialized bipolar process technologies and then only with some difficulty.

Accordingly, A/D conversion techniques based on "oversampling" have been viewed favorably since this methodology obviates the need for trimming and for certain precision circuits. A/D converters utilizing oversampling operate at a clock rate much higher than the data rate of the sampled analog signal to be processed. The oversampling ratio of an A/D converter refers to the ratio of the clock rate of the A/D converter to the Nyquist sampling rate associated with the incident analog signal. As is well known, the value of the Nyquist rate is dependent upon the maximum frequency of interest included within the incident analog signal.

One class of oversampling A/D converters is based on a processing scheme known as sigma-delta modulation. Conventional sigma-delta modulators employ an internal 1-bit quantizer and output a bit stream whose pulse density is proportional to the amplitude of the applied input signal. Single bit internal quantizers are utilized, despite an inherent lack of resolution, in part because theoretically distortion-free quantization may be effected. Although both accuracy and stability of a sigma-delta converter may be enhanced through multi-bit internal quantization, multi-bit quantization also requires utilization of a multi-bit internal digital to analog converter (DAC). The internal DAC must be linear to the full accuracy of the overall sigma-delta converter so as to prevent nonlinearities in the DAC from negating any accuracy improvements achieved through multi-bit quantization. For high resolution A/D converters the requisite linearity in the DAC is typically achieved only by using ancillary (off-chip) compensation elements and/or by component trimming.

In a further effort to effectuate high resolution, conventional sigma-delta A/D converters have been operative at a sampling rate which gives rise to a high oversampling ratio. Unfortunately, a high oversampling ratio limits the analog signal bandwidth which may be accurately processed by a single converter. As a consequence, conventional sigma-delta A/D converters have been constrained to applications involving, for example, compact disks or audio systems. Moreover, the oversampling ratio is inversely proportional to the speed at which an analog signal may be converted to the digital domain. It follows that the high oversampling ratios of conventional sigma-delta A/D converters may preclude their inclusion in certain high speed processing applications. For example, it generally requires a cascade of three first order sigma-delta modulators employing 1-bit quantization and oversampling ratios in excess of 64 to achieve 15 to 16 bit resolution.

Matsuya, et. al. disclose an analog-to-digital converter having multiple cascaded sigma-delta stages of 1-bit internal quantization in "A 16-bit Oversampling A-to-D Conversion Technology Using Triple-Integration Noise Shaping", *IEEE Journal of Solid-State Circuits*, vol. SC-22, no. 6, p. 921, December 1987. The cascaded converter disclosed therein effected improvements in resolution by implementing a network disposed to cancel the quantization noise engendered by the first $n-1$ stages of an n-stage cascaded converter. Despite the advantages afforded by the noise cancellation network, the ultimate resolution of the Matsuya converter for a given oversampling ratio is limited due to the utilization of internal single bit quantization. In addition, each stage within the Matsuya converter is disposed to deliver a quantization error signal to the stage immediately subsequent thereto. Unfortunately, the small magnitude of the error signal relative to the dynamic range of each sigma-delta stage makes the degree of noise cancellation more sensitive to component variation. Further, since the relative magnitude of the error signal becomes smaller with each successive stage, extension of the Matsuya converter to multiple stages yields diminishing improvements in overall A/D conversion accuracy.

Hence, a need in the art exists for a precision sigma-delta A/D converter disposed to be extended to a desired number of cascaded stages, with each stage being operative at a sampling rate giving rise to a relatively low oversampling ratio.

SUMMARY OF THE INVENTION

The need in the art for a precision sigma-delta A/D converter having a desired number of cascaded stages is addressed by the multi-stage sigma-delta analog-to-digital converter of the present invention. The inventive multi-stage sigma-delta converter is operative to convert an analog input signal to an output sequence of digital words. The converter of the present invention includes a first sigma-delta converter stage for generating a first sequence of digital words and a quantization error signal in response to the analog input signal. An interstage amplifier then amplifies the quantization error signal by a first gain factor. The present invention further includes a second sigma-delta converter stage for generating a second sequence of digital words in response to the amplified quantization error signal. The first and second sequences are next filtered by a digital noise cancellation network and the filtered second sequence is divided by the first gain factor via a divider circuit. A summing circuit provides the output sequence of digital words by summing the filtered first sequence and the divided second sequence. This architecture is directly extendible to 3 or more stages and each stage has an additional interstage amplifier which further suppresses the quantization errors.

DETAILED DESCRIPTION OF THE INVENTION

Figure 1:
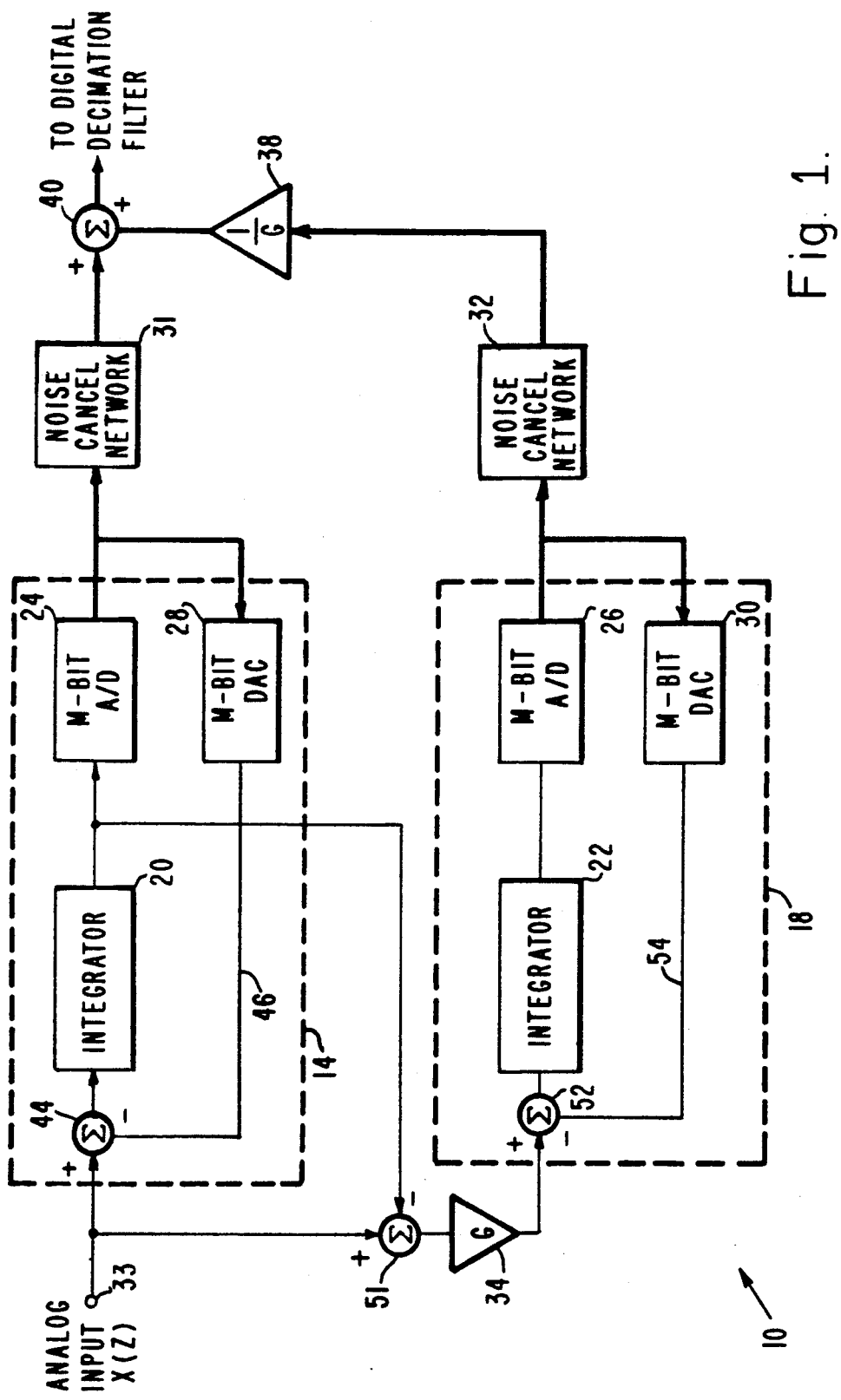
FIG. 1 is a block diagrammatic representation of the multi-stage sigma-delta analog-to-digital converter of the present invention.

FIG. 1 is a block diagrammatic representation of the multi-stage sigma-delta analog-to-digital converter 10 of the present invention. The multi-stage converter 10 includes a first sigma-delta converter stage 14 and a second sigma-delta converter stage 18. Although only a two-stage embodiment of the present invention is depicted in FIG. 1 for the purpose of clarity, it will be apparent from the subsequent discussion that preferred embodiments of the present invention may be extended to include several or more stages. The first and second stages 14, 18 employ feedback configurations which respectively include first and second integrators 20, 22, first and second M-bit quantizers 24, 26 and first and second M-bit digital to analog converters (DAC's) 28, 30. Electrically connected to the first and second stages are first and second digital noise cancellation networks 31, 32. The second network 32 also contains the digital coefficients c and d. The, coefficients c and d are used to compensate for errors in the analog components, e.g., integrator gain constant, finite operation amplifier gain, etc.

The first and second stages 14, 18 are operative at a sampling frequency which significantly exceeds the highest frequency of interest of an analog input signal X(z) impressed on an input node 33. As is discussed more fully below, the first stage 14 is disposed to generate a first sequence of digital words representative of the analog input signal X(z). This first digital sequence is then passed through the first digital network 31. In addition, the first integrator 20 accumulates the difference between the analog input signal and the first sequence of digital words, thereby enabling an error signal proportional to the quantization noise associated with the first quantizer 24 to be delivered to an interstage amplifier 34. The interstage amplifier 34 amplifies the error signal so as to utilize the full dynamic range of the second sigma-delta stage 18. The amplified error signal is then quantized by the second stage 18 and processed by the second noise cancellation network 32 (containing the digital correction coefficients c,d). A interstage digital divider reduces the magnitude of the output from the second noise cancellation network 32 by a factor G equivalent to the gain G of the interstage amplifier 34. The first and second noise cancellation networks 31, 32 are characterized by transfer functions $H_A(z)$ and $H_B(z)$, chosen such that combination of the digital output from the networks 31, 32 at an output summing node 40 results in cancellation of the quantization noise associated with the first stage 14. In this manner the inventive sigma-delta converter 10 is operative to provide a high resolution digital representation of the analog input signal X(z).

Figure 2:
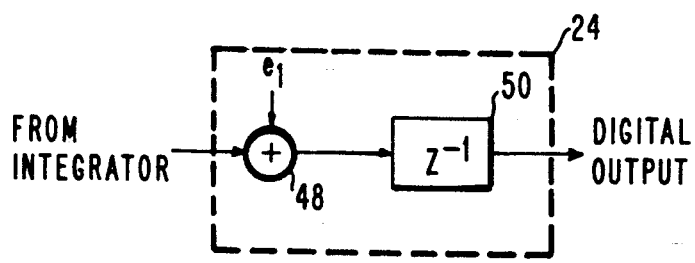
FIG. 2 is an illustrative representation of the addition of the quantization noise ($e_1$) of the first internal analog-to-digital converter with the analog output from the first integrator.

As shown in FIG. 1, the analog input X(z) is combined at an input summing node 44 with a feedback signal impressed on a feedback line 46 by the first M-bit DAC 28. Coupled to the summing node 44 is the first integrator 20. The transfer function of the integrator 20 may be represented in the z-domain as $k_A/(1-z^{-1})$, where $k_A$ is an integration constant. An analog signal generate by the integrator 20 is provided to the first M-bit A/D converters 24. FIG. 2 provides an illustrative representation of the addition of quantization noise ($e_1$) of the first A/D converters 24 with the analog output from the integrator 20. As shown in FIG. 2 this summation occurs at a node 48, with a delay block 50 included to represent the propagation delay through the first A/D converters 24. A z-domain signal transfer function $H_S(z)$ existing between the input node 33 and the output of the first A/D converters 24 is given by:

$$H_S(z) = \frac{k_A z^{-1}}{1 + (k_A - 1)z^{-1}} \quad [1]$$

Similarly, a z-domain noise transfer function $H_N(z)$ existing between the summing node 48 (see FIG. 2) and the output of the first A/D 24 may be expressed as:

$$H_N(z) = \frac{z^{-1}(1 - z^{-1})}{1 + (k_A - 1)z^{-1}} \quad [2]$$

It follows that the output $V_{out1}(z)$ of the first sigma-delta stage 14, or equivalently of the first A/D converters 24, may be represented as:

$$V_{out1}(z) = H_S(z)[X(z)] + H_N(z)[e_1] \quad [3]$$

As shown in FIG. 1, the analog input X(z) is combined with the analog signal engendered by the integrator 20 at an interstage summing node 51. This combination produces an error signal substantially identical to first stage quantization noise $e_1$ delayed by one clock cycle, which is then amplified by an interstage amplifier 34. Since the maximum magnitude of $e_1$ will be substantially equivalent to the value of the least significant bit (LSB) within the A/D converter 24, the gain G of the amplifier 34 could in principle be set to a maximum value less than or equal to $2^M$ (where, again, M is the number of bits in the A/D converter 24. However, the possible existence of extraneous sources of noise within a physical realization of the converter 10 favors selection of a gain G of approximately two-thirds of this maximum value.

The amplified error signal is combined at a second stage summing node 52 with a feedback signal impressed on a feedback line 54 by the M-bit DAC 30. The amplified error signal may be denoted as $X'(z)$ and is expressed as:

$$X'(z) = G\left[\frac{(1 - k_A)(1 - z^{-1})X(z) + k_A z^{-1}e_1}{1 + (k_A - 1)z^{-1}}\right] \quad [4]$$

In the embodiment of FIG. 1 the second integrator 22, second M-bit A/D converter 26 and second M-bit DAC 30 are substantially equivalent to the first integrator 20, first M-bit A/D converter 24 and first M-bit DAC 28, with the exception that the second integrator 22 has an integration constant of $k_B$. Accordingly, the digital output $v_{out2}(z)$ generated by the second sigma-delta stage 18 and provided to the second noise cancellation network 32, may be expressed as:

$$V_{out2}(z) = H_S(z)[X(z)'] + H_N(z)[e_2] \quad [5]$$

where $e_2$ represents the quantization noise produced by the second M-bit A/D converter 26. Substituting equation [4] into equation [5] yields:

$$v_{out2} = G\left[\frac{z^{-1}k_B(1 - k_A)(1 - z^{-1})X(z) + k_A k_B z^{-2}e_1}{1 + (k_A - 1)z^{-1}} + \frac{z^{-1}(1 - z^{-1})e_2}{G}\right] \quad [6]$$

From FIG. 1 it is apparent that the digital output $v_{out}$ of the inventive converter 10 generated at the summing node 40 may be represented by the following:

$$v_{out} = v_{out1}[H_A(z)] + (1/G)v_{out2}[H_B(z)] \quad [7]$$

In the case where the integrators 20, 22 are ideal (i.e. $k_A = k_B = 1.0$), equation [7] reduces to:

$$v_{out} = z^{-1}H_A(z)X(z) + [z^{-1}(1 - z^{-1})H_A(z) + z^{-2}H_B(z)]e_1 + \quad [8]$$

$$\frac{z^{-1}(1 - z^{-1})H_B(z)e_2}{G}$$

On the basis of equation [8] the first and second transfer functions $H_A(z)$ and $H_B(z)$ of the first and second noise cancellation networks 31, 32 may be formulated so as to effectively eliminate the first stage quantization noise $e_1$ from contributing to the digital output of the inventive sigma-delta A/D converter 10. In particular, for transfer functions $H_A(z)$ and $H_B(z)$ given by, $$H_A(z) = z^{31\ 1} \quad [9]$$

and, $$H_B(z) = (1 - z^{-1}) \quad [10]$$

the digital output $v_{out}$ of the inventive converter 10 generated at the summing node 40 may be represented by the following:

$$v_{out} = z^{-2}X(z) - (1/G)z^{-1}(1 - z^{-1})^2 e_2 \quad [11]$$

Inspection of equation [11] reveals that the first stage quantization noise $e_1$ has been eliminated from the output of the inventive converter 10, thus enhancing the signal to noise ratio (SNR) thereof. Further, the second stage quantization noise $e_2$ has been high-pass filtered to second order and reduced by the interstage gain factor G, the latter feature not being present within the converter of Matsuya (discussed in the Background of the Invention). Thus, the gain G provides additional noise suppression in addition to enabling fuller exploitation of the dynamic range of the second sigma-delta stage 18. It is noted that the present invention facilitates employment of interstage gain G in excess of unity by providing multi-bit internal quantization. That is, the magnitude of the quantization error signal is approximately limited to the magnitude of the least significant bit of the A/D converter 24—which allows the amplification thereof without inducing overflow in the second sigma-delta stage 18. Increasing the resolution of the A/D converter 24 (by incorporating more bits therein) inherently enhances the overall resolution of the converter 10, and also allows a commensurate increase in the value of the gain G. Again, the gain G could in principle be set to a maximum value less than or equal to $2^M$, with a gain of two-thirds of this maximum value typically being employed in practice.

In general, the diminution in the quantization noise from an nth stage of a sigma-delta converter fabricated in accordance with the teachings of the present invention attributable to interstage gain reduction will be equivalent to $G^{n-1}$. This allows expansion of the inventive sigma-delta converter to multiple stages with only minimal added quantization noise, thus facilitating further improvement in SNR.

In the case of non-ideal integrators 20, 22 (i.e. wherein $k_A$, $k_B$ are not equal to unity), expressions may again be found for first and second noise cancellation networks $H_A'$, $H_B'$ which substantially eliminate the contribution of the first stage quantization noise $e_1$ from the digital output of the inventive converter 10. In particular, by setting the summation of all terms within equation [11] which include $e_1$ to zero, the following condition for the elimination of the first stage quantization noise is obtained:

$$z^{-1}(1 - z^{-1})H_A'(z) = \frac{k_A k_B z^{-2}H_B'(z)}{1 + (k_B - 1)z^{-1}} \quad [12]$$

Selecting $H_A'(z) = z^{-1}$, equation [12] yields for $H_B'(z)$:

$$H_B'(z) = (z^{-1} - 1)(c + dz^{-1}) \quad [—]$$

where $c = 1/k_A k_B$ and $d = (1 - 1/k_B)/k_A$. The values of c and d may be adjusted in response to deviations in the values of $k_A$ and $k_B$ from the ideal value of unity. These adjustments allow precise matching between imperfect analog components within the first and second stages 14, 18 and the digital networks 31, 32, which in turn enables a substantially complete cancellation of the first stage quantization noise $e_1$. The values of c and d can also be adjusted to compensate for errors due to the fact that the operational amplifiers within the integrator have finite open-loop gain.

Figure 3:
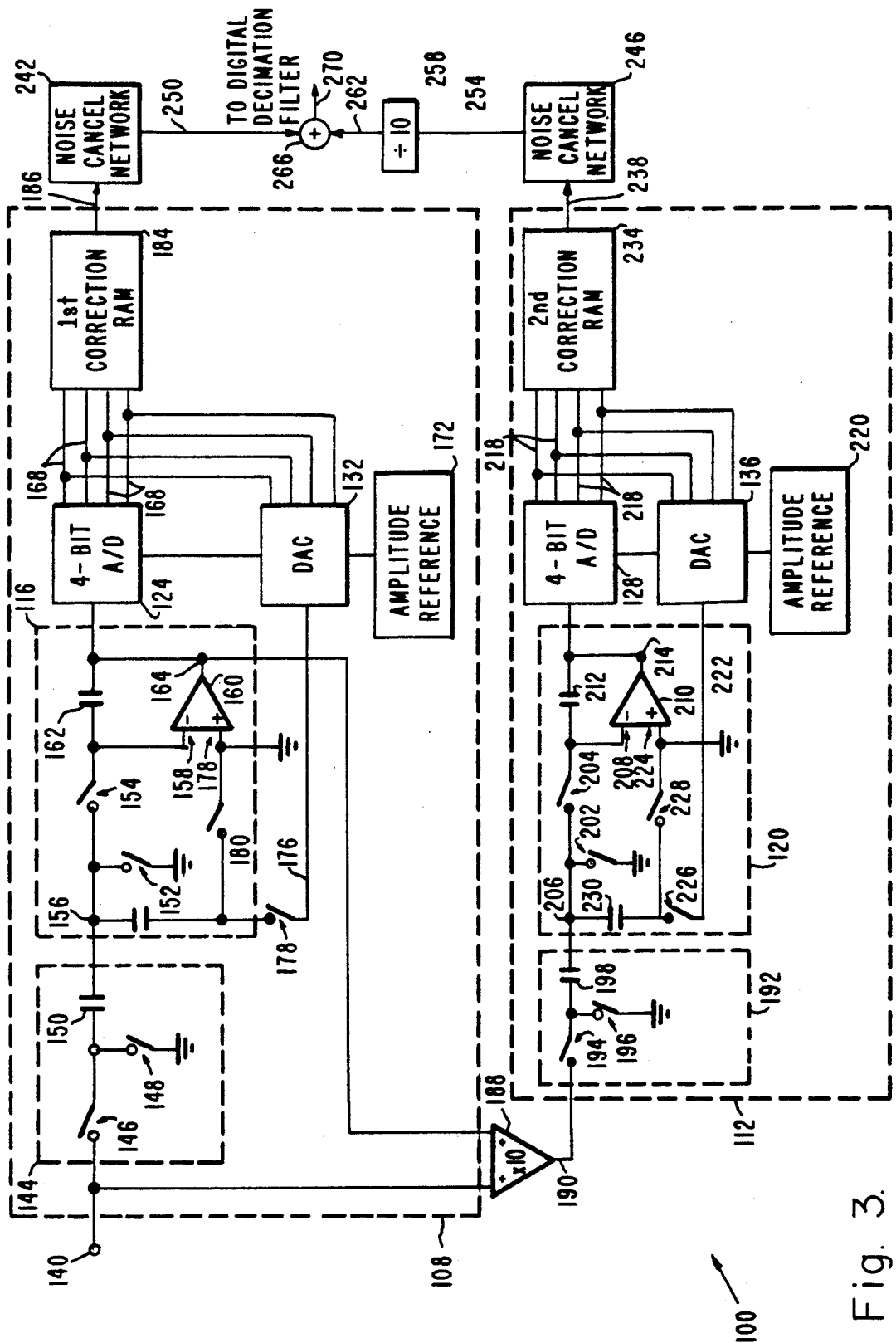
FIG. 3 is a more detailed partially block diagrammatic, partially schematic representation of the multi-stage sigma-delta converter of the present invention.

FIG. 3 shows a more detailed partially block diagrammatic, partially schematic representation of the multi-stage sigma-delta converter 100 of the present invention. Again, in the two-stage embodiment of FIG. 3 the inventive converter 100 includes a first sigma-delta converter stage 108 and a second sigma-delta converter stage 112 under timing control by a system clock (not shown). The first and second stages 108, 112 employ feedback configurations which respectively include first and second integrators 116, 120, first and second 4-bit quantizers 124, 128 and first and second 4-bit digital to analog converters (DAC's) 132, 136.

Again, an analog input is impressed on an input node 140 and sampled by a first stage sampler 144. The first stage sampler 144 includes first and second electronic switches 146, 148. The switches 146, 148 are typically realized by a CMOS or NMOS transmission gate. The first and second switches 146, 148 are both coupled to the system clock (not shown) and are alternately actuated (closed) in response to a square wave therefrom. For example, the first switch 146 may be closed and the second switch 148 opened, in response to the high state of the square wave. The first and second switches 146, 148 are coupled to an input capacitor 150.

As shown in FIG. 3, the integrator 116 includes third and fourth alternately actuated switches 152, 154, with the third switch 152 operating in synchrony with the second switch 148. The first switch 152 is connected between a summing node 156 and ground, while the second switch 154 links the summing node 156 with the inverting terminal 158 of an operational amplifier 160. An integrating capacitor 162 is connected between the inverting terminal 158 and an output node 164 of the operational amplifier 160. The voltage at the output node 164 defines the value of the sampled analog voltage quantized by the 4-bit quantizer 124. The quantizer 124 may be realized by a conventional 4-bit analog-to-digital converter which includes, for example, a network of 15 comparators and an encoder. The quantizer 124 is operative to impress a 4-bit digital word upon four signal lines 168 during each clock cycle.

The digital output from the quantizer 124 is monitored by the 4-bit digital to analog (D/A) converter 132. The 4-bit D/A 132 may be conventionally realized and is operative to scale the voltage provided a first amplitude reference 172 in order to impress a first analog feedback signal on a feedback line 176. The D/A converter 132 is electrically connected to the system clock and hence updates the value of the analog feedback signal at the clock rate thereof. The first feedback signal is routed to a noninverting terminal 178 of the operational amplifier 160 by way of fifth and sixth alternately actuated switches 178, 180. A second capacitor 182 connects the summing node 156 to the fifth switch 178, which operates synchronously with the first switch 146.

Figure 4:
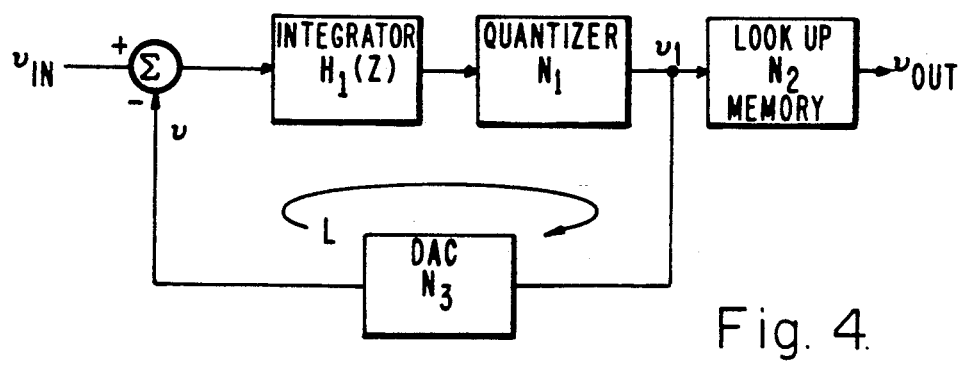
FIG. 4 is a block diagrammatic representation of a system designed to illustrate the digital quantization noise correction scheme incorporated within the present invention.

The first sigma-delta stage 108 also includes a first random access memory (RAM) correction module 184. The correction module 184 effects digital cancellation of nonlinearities inhering within the transfer function of the 4-bit DAC 132. The principle underlying this digital correction scheme may be explained by reference to FIG. 4. FIG. 4 shows a block diagrammatic representation of a system including first, second an third two-ports $N_1$, $N_2$, $N_3$. The two ports $N_1$, $N_2$, $N_3$ are time invariant, memory-less and have mildly nonlinear monotonic output/input characteristics $v_{out}(t) = N_i[v_{in'}(t)]$. The two-ports $N_1$, $N_3$ are arranged with a linear dynamic two-port $H_1(z)$ (typically, first or second order) around a feedback loop L. The signals present in the system of FIG. 4 may all be sampled-data analog, all digital, or mixed.

Assume that a frequency range exists where the loop gain of the feedback loop L greatly exceeds unity and that the system of FIG. 4 is stable. It follows that for signal frequencies within this range the feedback loop induces a feedback voltage $v_f(t)$ to approximate an input voltage $v_{in}(t)$. In addition, it is apparent from FIG. 4 that $v_f(t) = N_3[v_1(t)]$ and $v_{out}(t) = N_2[v_1(t)]$. Now let $N_2[\ ]$ be equivalent to $N_3[\ ]$, i.e., let the nonlinear characteristics of two-ports $N_2$ and $N_3$ be matched. Then, $v_{out}(t) = N_2[v_1(t)] = N_3[v_1(t)] = v_f(t)$, which is substantially equivalent to $v_{in}(t)$. It is thus evident that if $N_3$ represents the 4-bit DAC 132 (FIG. 3), $H_1(z)$ represents the integrator 116, $N_1(z)$ represents the 4-bit A/D converter 124 and if $N_2$ represents the RAM correction module 184, then linear data conversion can be provided despite nonlinearities present within the D/A converter 132.

Returning to FIG. 3, the first RAM correction module 184 may be realized by a programmable memory, e.g. by an EPROM. The RAM correction module 184 is programmed to convert a 4-bit digital word present on the signal lines 168 to an M-bit digital word, where M represents the bit accuracy of the corrected output from the first stage sigma-delta converter 108. In the embodiment of FIG. 3 sixteen bit accuracy is achieved and thus the corrected digital output of the converter 108 is impressed on sixteen signal lines 186.

The RAM correction module 184 may be programmed during a calibration routine, during which the generally nonlinear transfer function of the D/A converter 132 is measured and the resultant data stored within the module 184. For example, in a particular calibration process the D/A converter 132 is electrically isolated from the A/D converter 124 and supplied with a digital ramp signal generated by a 4-bit counter. During the calibration procedure the A/D converter 124 is replaced by a single bit quantizer and a digital decimation filter is coupled thereto to provide a sixteen bit digital output. Since a single bit sigma-delta converter is inherently linear, the sixteen bit digital output from the decimation filter will provide the nonlinearity data on the 4-bit D/A converter to be stored in the first RAM correction module 184. The calibration process requires approximately $2^{N+M}$ clock periods, where N is the bit accuracy of the D/A converter to be calibrated and M is the number of bits within the digital words generated by the correction module 184. Accordingly, in the embodiment of FIG. 3 calibration can be performed in $2^{20}$ clock periods. The calibration procedure can be performed at the relatively fast (i.e. oversampling) clock rate of the first sigma-delta stage 108 and thus requires only a short time.

As shown in FIG. 3, the voltage impressed on the node 164 by the operational amplifier 160 and the analog input signal are provided to an interstage amplifier 188. The interstage amplifier 188 is disposed to place an error signal indicative of the quantization error of the 4-bit A/D converter on a second stage input line 190. Again, assuming the absence of extraneous noise sources and an ideal realization of the first and second sigma-delta stages 108, 112, the maximum magnitude of the quantization error signal would be substantially equivalent to the value of the least significant bit of the A/D converter 124. Under these conditions and further assuming the first and second sigma-delta converters 108 to be of substantially equivalent dynamic range, the gain of amplifier 188 could be set at sixteen. Nonetheless, in an actual physical realization of the inventive converter 100 a gain factor of approximately ten would adequately guard against overflow within the second sigma-delta stage 112. The interstage amplifier 188 thus enables utilization of a substantial portion of the dynamic range of the second stage for processing the first stage quantization error signal. In this way the interstage gain feature of the present enables more accurate cancellation of the first stage quantization noise than may be effected through conventional cascaded sigma-delta converters.

The quantization error signal is sampled by a second stage sampler 192. The second stage sampler 192 includes seventh and eighth electronic switches 194, 196 alternately actuated by the system clock (not shown), with the seventh switch 194 being actuated thereby in synchrony with the first switch 146. The seventh and eighth switches 194, 196 are coupled to a second stage input capacitor 198.

As shown in FIG. 3, the second integrator 120 includes ninth and tenth alternately actuated switches 202, 204—the ninth switch 202 operating synchronously with the second switch 148. The ninth switch 202 is connected between a summing node 206 and ground, while the tenth switch 204 links the summing node 206 with the inverting terminal 208 of an operational amplifier 210. An integrating capacitor 212 is connected between the inverting terminal 208 and an output node 214 of the operational amplifier 210. The signal value at the output node 214 defines the value of the sampled analog voltage quantized by the 4-bit quantizer 128. Again, the quantizer 128 may be realized by a conventional 4-bit analog-to-digital converter which includes, for example, a network of seven comparators and an encoder. The quantizer 128 is operative to impress a 4-bit digital word upon four signal lines 218 during each clock cycle.

The digital output from the quantizer 128 is monitored by the 4-bit digital to analog (D/A) converter 136. The 4-bit DAC 136 may be conventionally realized and is operative to scale the voltage provided by a second amplitude reference 220 in order to impress a second analog feedback signal on a second feedback line 222. The second D/A converter 136 is electrically connected to the system clock and hence updates the value of the second analog feedback signal at the clock rate thereof. The second feedback signal is routed to a noninverting terminal 224 of the operational amplifier 210 by way of eleventh and twelfth alternately actuated switches 226, 228. A third capacitor 230 connects the summing node 206 to the eleventh and twelfth switches 226, 228—the eleventh switch operating in synchrony with the first switch 146.

The second sigma-delta stage 112 also includes a second RAM correction module 234. As discussed above, the correction module 234 effects digital cancellation of nonlinearities inhering within the transfer function of the 4-bit DAC 136. The second RAM correction module 234 may also be realized by a programmable memory (i.e. an EPROM) and can be programmed through performance of a calibration procedure substantially identical to that described above with reference to the first correction module 184. The second RAM correction module 234 is operative to convert a 4-bit digital word present on the signal lines 218 to an M-bit digital word, where M represents the bit accuracy of the corrected output from the second stage sigma-delta converter 112. Again, in the embodiment of FIG. 3 the inventive converter 100 is disposed to provide sixteen bit accuracy. Thus, the corrected digital output of the converter 112 is impressed on sixteen signal lines 238.

As shown in FIG. 3, the sixteen-bit digital output from the first and second sigma-delta stages 108, 112 present on the signal lines 186, 238 addresses first and second noise cancellation networks 242, 246. As previously discussed, transfer functions $H_{A1}(z)$ and $H_{B1}(z)$ of the first and second noise cancellation networks 242, 246 may be formulated so as to effectively eliminate the first stage quantization noise from contributing to the digital output of the inventive sigma-delta A/D converter 100. The transfer functions $H_{A1}(z)$ and $H_{B1}(z)$ suitable for effecting noise cancellation within the inventive converter are again given by:

$$H_{A1}(z) = z^{-1} \quad [14]$$

and, $$H_{B1}(z) = z^{-1} - 1. \quad [15]$$

Note that c and d can take on other values as appropriate. For finite operational amplifier gain errors, c and d would be different.

The first and second noise cancellation networks 242, 246 are electrically connected to the system clock (not shown) and respectively impress sixteen bit digital words upon first and second sets 250, 254 of signal lines. The sixteen-bit digital words present on the second set of signal lines 254 are passed through a conventional divider circuit 258, in which they are divided by ten. The degree of magnitude reduction effected by the divider circuit 258 is selected to be equivalent to the gain of the amplifier 188. In this way the magnitude of the quantization noise from the first sigma-delta stage 108 is normalized subsequent to processing by the second sigma-delta stage 112 and second noise cancellation network 246. Accordingly, the incorporation of each additional sigma-delta stage in alternative embodiments of the present invention will be accompanied by the inclusion of a separate interstage amplifier and complementary divider circuit.

As shown in FIG. 3, the sixteen bit output of the divider circuit 258 is impressed on a third set of signal lines 262. The sixteen bit words present on the first and third sets of signal lines 250, 262 are then combined within a conventional sixteen bit summer 266. The summer 266 then impresses the sixteen bit digital output of the inventive sigma-delta converter 100 on a set of output signal lines 270. The sixteen bit digital output of the converter 100 is generated at the clock rate thereof, which is high relative to the rate at which the highest frequency of interest within the analog input signal would need to sampled to satisfy the Nyquist criterion. It will therefore generally be desired to couple a digital decimation filter to the set of output signal lines 270. Those skilled in the art may appreciate decimation filter techniques to transform the oversampled sixteen bit output of the inventive converter 100 to a lower sampling rate. Two categories of filters from which decimation filters may be realized include finite impulse response (FIR) and infinite impulse response (IIR) filters. The design of these filters is described in, for example, *Theory and Application of Digital Signal Processing* by Lawrence R. Rabiner and Bernard Gold, 1975 Prentice-Hall International, Inc.

Figure 5:
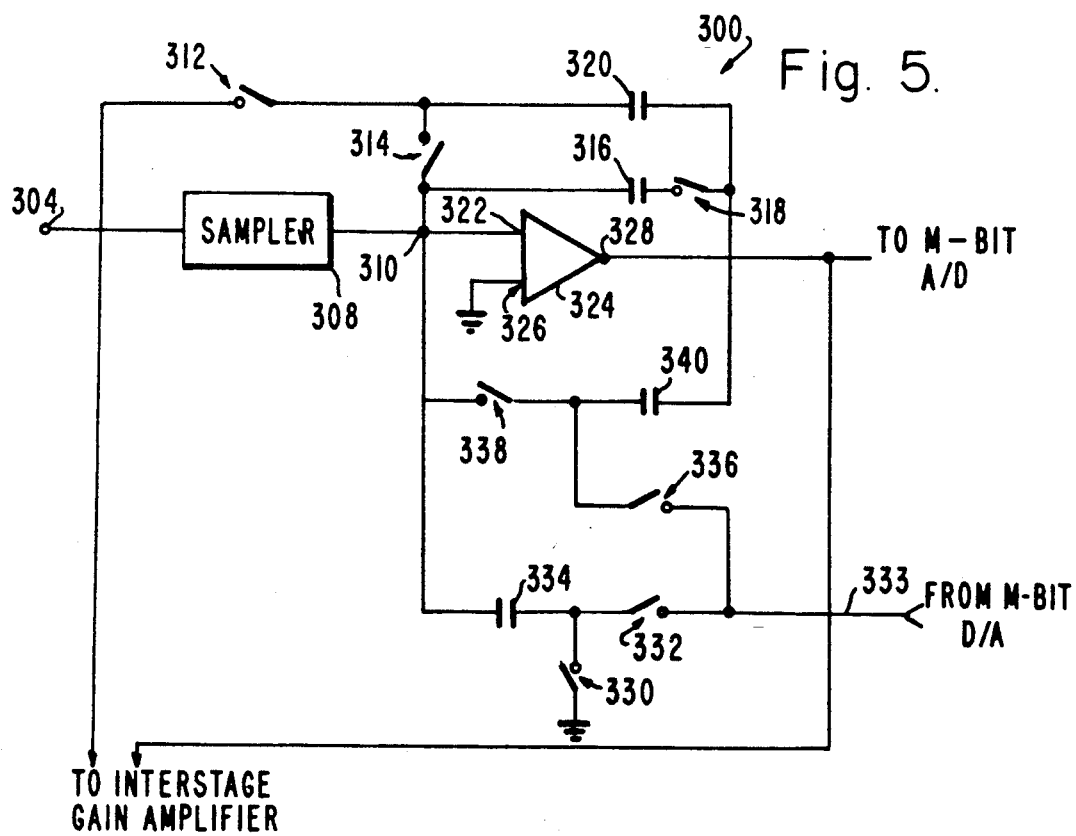
FIG. 5 is a schematic representation of an offset and gain compensated switched capacitor integrator disposed to engender primarily only gain errors as a consequence of imperfections in the analog components included therein.

Referring again to equation [13], it was seen that the coefficients c and d therein could be adjusted in response to deviations in the values of $k_A$ and $k_B$ from unity. The values of $k_A$ and $k_B$ are indicative of the gain of the integrators 20, 22 and hence imperfections in the gain (as distinct from the phase) of the integrators 20, 22 induce variation in the gain constants $k_A$ and $k_B$. Hence, to the extent that the integrators 20, 22 may be designed such that internal component variation gives rise mainly to gain rather than phase errors, the values of the coefficients c and d may be selected to compensate for any such component variation. FIG. 5 is a schematic representation of an offset and gain compensated switched capacitor integrator 300 designed such that imperfections in the analog components included therein primarily engender only gain errors. Such analog component variation may include, for example, finite operational amplifier gain and capacitor mismatches.

As shown in FIG. 5, the integrator 300 is disposed to operate within a sigma-delta converter stage in a manner similar to the mode in which the integrator 116 operates within the first converter stage 108 (FIG. 3). Accordingly, an analog input is again impressed on an input node 304 and sampled by a sampler 308. The sampler 308 is substantially equivalent to the first stage sampler 144 (FIG. 3). The sampler 308 is coupled to a first summing node 310 of the integrator 300, with the summing node 310 being linked to the input node 304 by first and second alternately actuated switches 312, 314. The summing node 310 is also connected by a first capacitor 316 to a third switch 318, the third switch 318 being actuated in synchrony with the first switch 312. The integrator 300 further includes a second capacitor 320, which links the third switch 318 with the first and second switches 312, 314. Also coupled to the summing node 310 is an inverting terminal 322 of an operational amplifier 324. A noninverting terminal 326 of the operational amplifier 324 is connected to ground, while the amplifier 324 impresses an output voltage on an output node 328. The output voltage addresses an M-bit A/D converter (not shown).

The integrator 300 also includes fourth and fifth alternately actuated switches 330, 332, with the fourth switch 330 operating in synchrony with the second switch 314. The fourth and fifth switches 330, 332 sample an analog feedback voltage supplied by an M-bit D/A converter (not shown), the feedback voltage being impressed on a feedback line 333. A third capacitor 334 connects the fourth and fifth switches to the first summing node 310. Sixth and seventh alternately actuated switches 336, 338 provide a path between the feedback line 333 and the first summing node 310, with the sixth switch 336 operating synchronously with the first switch 312. A fourth capacitor 340 links the sixth and seventh switches 336, 338 with the output node 328. The first, second, third and fourth capacitors 316, 320, 334, 340 are of an equivalent capacitance C.

The multi-stage converter of the present invention can be physically realized from discrete components, but may also be readily fabricated as an integrated circuit. Moreover, the primarily digital composition of the inventive converter facilitates its implementation as a very large scale integrated circuit (VLSI chip). The ease with which digital architectures may be realized as integrated circuits in a variety of semiconductor technologies is well known.

Thus the present invention has been described with reference to a particular embodiment in connection with a particular application. Those having ordinary skill in the art and access to the teachings of the present invention will recognize additional modifications and applications within the scope thereof. For example, the integrating networks within each sigma-delta stage may be realized by circuit topologies other than the particular switched-capacitor integrating network described herein without departing from the scope of the present invention. Similarly, the invention is not limited to a particular scale of internal quantization—although preferred embodiments of the present invention will typically employ internal quantizers of approximately four bits. Further, alternative embodiments of the inventive sigma-delta converter may include in excess of two stages.

It is therefore contemplated by the appended claims to cover any and all such modifications.

Accordingly,
What is claimed is:

1. An analog-to-digital converter for converting an analog input signal of the form X(z) to an output sequence of digital words comprising:

a first sigma-delta converter stage including a first multi-bit quantizer for generating a first sequence of digital words and a first quantization error signal $e_1$ in response to said analog input signal;

means for amplifying said error signal by a gain factor G;

a second sigma-delta converter stage for generating a second sequence of digital words in response to said amplified quantization error signal;

a first noise cancellation network disposed at the output of said first stage including first means for providing a first transfer function $H_A(z)$;

a second noise cancellation network disposed at the output of said second stage including second means for providing a second transfer function $H_B(z)$, said first and second transfer functions being such that said first and second noise cancellation networks are effective, on a summation of the outputs thereof, to substantially eliminate any contribution of the said error signal from the output of said converter; and means for summing the outputs of said first and second noise cancellation networks to provide the output of said converter.

2. The invention of claim 1 including means for amplifying the output of said second noise cancellation stage by a gain factor of 1/G.

3. The invention of claim 2 wherein said second sigma-delta converter stage includes a second multi-bit quantizer for generating said second sequence of digital words in response to said first quantization error signal, said second multi-bit quantizer having a second quantizer error signal $e_2$ associated therewith.

4. The invention of claim 3 wherein said first transfer function $H_A(z)$ of said first noise cancellation stage is equal to $z^{-1}$, said second transfer function $H_B(z)$ of said second noise cancellation stage is equal to $(1-z^{-1})$ and the output voltage of said summing means $v_{out}$ is given by $v_{out} = z^{-2}X(z) - (1/G)z^{-1}(1-z^{-1})^2 e_2$.

5. The invention of claim 3 wherein said first sigma-delta converter stage includes a first integrator having a first integration constant $k_A$, said second sigma-delta converter stage includes a second integrator having a second integration constant $k_B$, said first transfer function $H_A(z)$ of said first noise cancellation stage is equal to $z^{-1}$ and said second transfer function $H_B(z)$ of said second noise cancellation stage is equal to $(z^{-1}-1)(c+dz^{-1})$, where $c=1/k_Ak_B$ and $d=(1-1/k_B)/k_A$.

6. The invention of claim 3 wherein said first and said second sigma-delta converter stages include first and second digital to analog converters respectively.

7. The invention of claim 6 including correction means for modifying said first and second sequences of digital words to correct for nonlinearities in the outputs of said first and second digital to analog converters.

8. The invention of claim 7 wherein said correction means includes a lookup memory.

9. The invention of claim 7 wherein said first sigma-delta converter stage includes first integrator having a first operational amplifier having a nonlinearity in the output thereof and said second sigma-delta converter stage includes a second integrator having a second operational amplifier having a nonlinearity in the output thereof.

10. The invention of claim 9 wherein said correction means includes a digital filter for correcting for said nonlinearities in said operational amplifiers.

* * * * *